(12) United States Patent  
Weaver et al.

(10) Patent No.: US 6,370,791 B1  
(45) Date of Patent: Apr. 16, 2002

(54) PROCESSING MACHINE WITH LOCKDOWN ROTOR

(75) Inventors: Robert Weaver; Ronald Schlagenhauser, both of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/522,797

(22) Filed: Mar. 10, 2000

(51) Int. Cl.⁷ .......................... F26B 17/24; B65G 49/07
(52) U.S. Cl. ............... 34/58; 34/109; 414/941
(58) Field of Search .................. 34/317, 58, 59, 34/315, 316, 442, 109; 432/253, 258; 414/936, 941

(56) References Cited

U.S. PATENT DOCUMENTS

| | | | |
|---|---|---|---|
| 4,300,581 A | | 11/1981 | Thompson |
| 4,568,234 A | * | 2/1986 | Lee et al. .................. 414/404 |
| 5,000,208 A | * | 3/1991 | Ludwig et al. ........... 134/58 R |
| 5,174,045 A | | 12/1992 | Thompson et al. |
| 5,232,328 A | | 8/1993 | Owczarz et al. |
| 5,339,539 A | * | 8/1994 | Shiraishi et al. ................ 34/58 |
| 5,452,795 A | * | 9/1995 | Gallagher et al. .......... 206/711 |
| 5,544,421 A | * | 8/1996 | Thompson et al. ............. 34/58 |
| 5,664,337 A | | 9/1997 | Davis et al. |
| 5,784,797 A | | 7/1998 | Curtis |
| 5,890,597 A | * | 4/1999 | Fan et al. .................... 206/710 |
| 6,125,551 A | * | 10/2000 | Bushong et al. .............. 34/318 |

FOREIGN PATENT DOCUMENTS

| | | | |
|---|---|---|---|
| JP | 06177111 A | * | 6/1994 |
| JP | 06232111 A | * | 8/1994 |
| JP | 08045895 A | * | 2/1996 |

* cited by examiner

Primary Examiner—Ira S. Lazarus  
Assistant Examiner—Greg Warder  
(74) Attorney, Agent, or Firm—Lyon & Lyon LLP

(57) ABSTRACT

In a machine for processing semiconductor wafers, a rotor includes two pairs of combs. A lock down mechanism has a lock bar, temporarily engaged and moved by a loading/unloading robot, drives a retainer against the edges of the wafers, to better hold them in place during processing. Contamination via generation of particles is reduced. Combs on the rotor have a resilient strip. The lower edges of the wafers compress slightly into or deflect the resilient strip, when urged into place by the lock down mechanism.

20 Claims, 9 Drawing Sheets

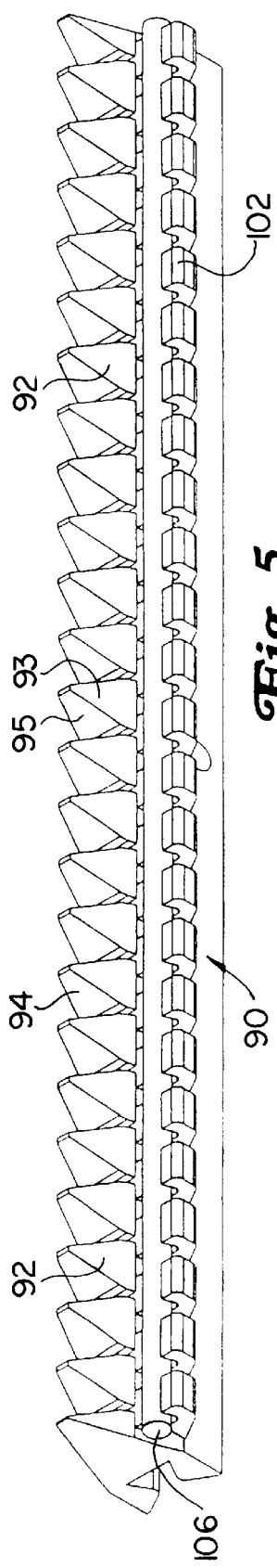
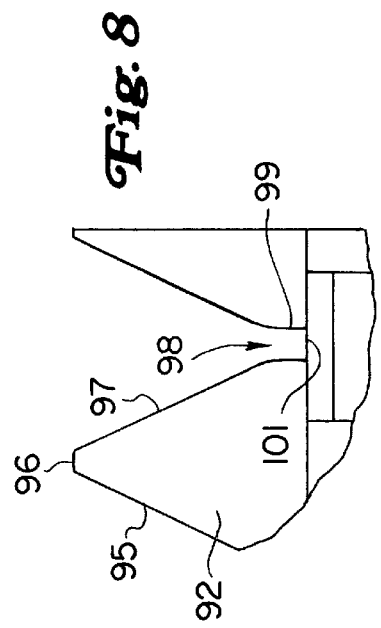
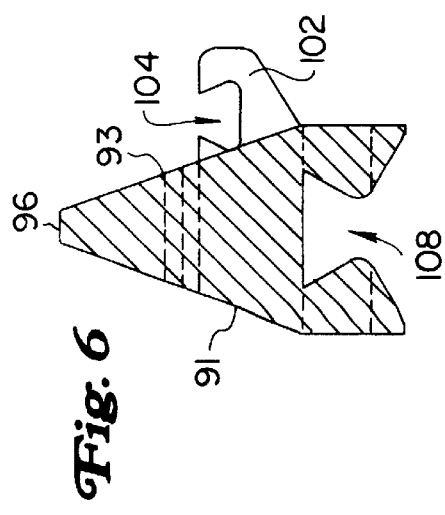
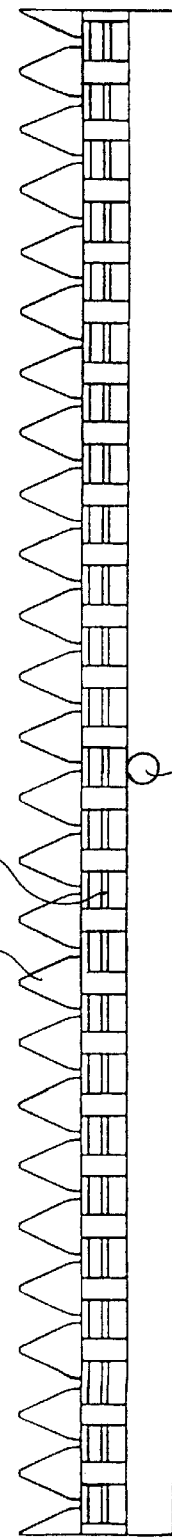

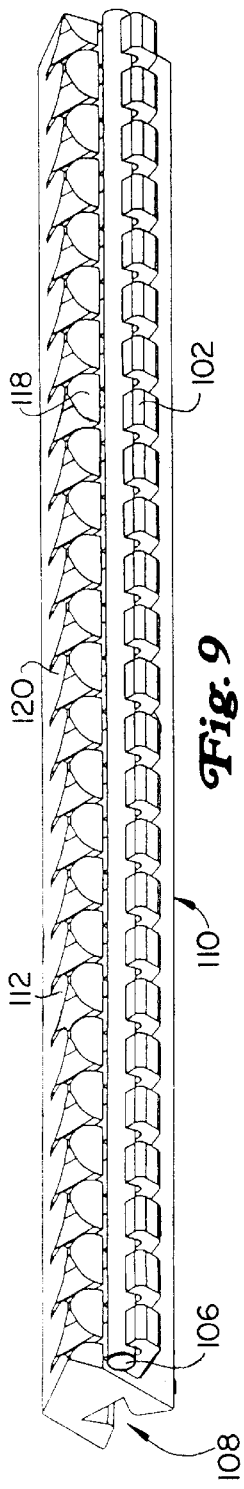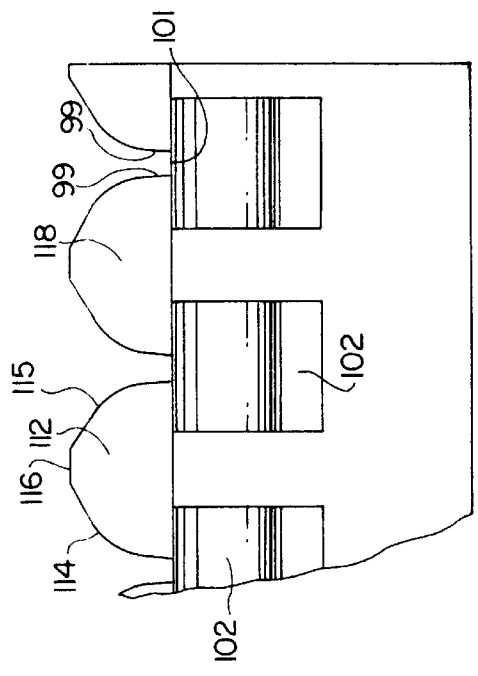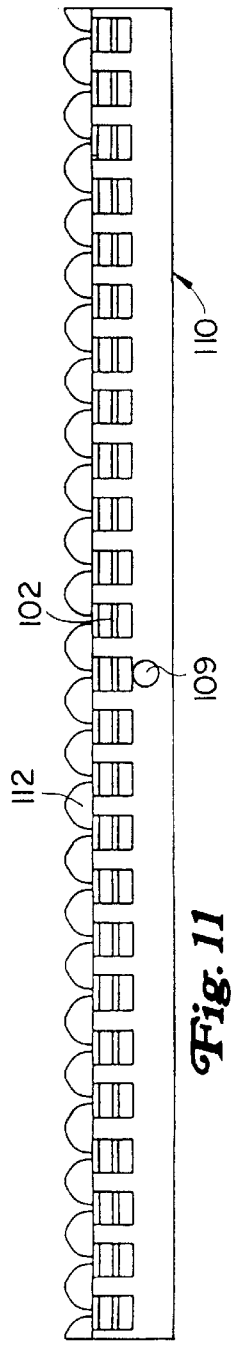

US 6,370,791 B1

PROCESSING MACHINE WITH LOCKDOWN ROTOR

BACKGROUND OF THE INVENTION

1. Field of the Invention

The present invention relates generally to centrifugal processing systems with rotors adapted to hold semiconductor articles, such as wafers or other semiconductor microelectronic articles.

2. Background

During the fabrication of flat media, such as microelectronic and semiconductor articles, various manufacturing steps involve the application of processing liquids and gases to the articles being processed. The application and removal of these processing fluids to and from the exposed surfaces of the workpieces or articles is enhanced by spinning movement of the articles within the processing chamber. Centrifugal action helps to apply fluids on the surfaces being processed.

As one example, after a flat media article has been cleaned, it must be dried. Any water droplets or other cleaning fluid that remain have at least some potential of leaving a residue or particles which may interfere with subsequent operations or cause defects in the resulting electronic products. As with most manufacturing operations relating to semiconductors and microelectronic devices, having an exceptionally clean environment, substantially free of particles, residues, etc., is a critical factor. Spinning the articles helps remove water or other processing liquids, so that such residues or particles are less likely to remain. Spinning also reduces processing time as droplets are physically removed via centrifugal force.

In the centrifugal processing machine described in the U.S. Pat. No. 5,784,797, incorporated by reference, the articles are held in a rotor that includes a rotor frame for holding the articles in an array, without an article carrier. The rotor has retainers which contact the articles to hold them in place. While this type of design may have met with varying degrees of success, several disadvantages remain. Specifically, contaminant particles may be created by the interaction of the edges of the articles, and the rotor surfaces supporting them.

Post-process analyses of the articles (semiconductor wafers), processed in a machine as described above, show residue signatures of carbon and fluorine, and in some cases chlorine. The residues were also present on the device side of the wafers, with the highest defect density near the edges of the wafers. This residue generation is caused by the relative clocking motion between the wafers and the rotor. This motion produces kinetic friction at the contact interfaces, causing the wafer edges to abrade, and wear on the thermoplastic rotor combs.

Therefore, there is a need for an improved machine to reduce or eliminate the creation, deposition and redistribution of residues and particles.

SUMMARY OF THE INVENTION

In a first aspect of the invention, a contact bar of a lockdown mechanism approaches the articles or wafers in a rotor with a trajectory that is largely normal to the edge of the wafers. This reduces or eliminates sliding contact at the edges of the articles and hence reduces particle generation.

In another, separate aspect of the present invention, improved combs include a plurality of projections and a rod or strip made from a resilient material. While the teeth of the combs guide and hold the articles, the resilient rod allows the articles to be better secured into the rotor, with less risk of damage.

Accordingly, it is an object of the invention to provide an improved rotor for use in processing semiconductor articles.

This and further objects and advantages will be apparent to those skilled in the art in connection with the drawings and the detailed description of the preferred embodiment set forth below.

BRIEF DESCRIPTION OF THE DRAWINGS

One or more preferred forms in the invention are described herein with reference to the accompanying drawings.

FIG. 5 is a perspective view of the base combs shown in FIGS. 3 and 4.

FIG. 6 is a cross-section view thereof.

FIG. 7 is a front view thereof.

FIG. 8 is an enlarged view of a section of the comb portion shown in FIG. 5.

FIG. 9 is a perspective view of the lateral or side combs, shown in FIG. 4.

FIG. 10 is a cross-section view thereof.

FIG. 11 is a front view thereof.

FIG. 12 is an enlarged view of a section of the comb shown in FIG. 9.

DETAILED DESCRIPTION OF THE PREFERRED EMBODIMENTS

Figure 1:
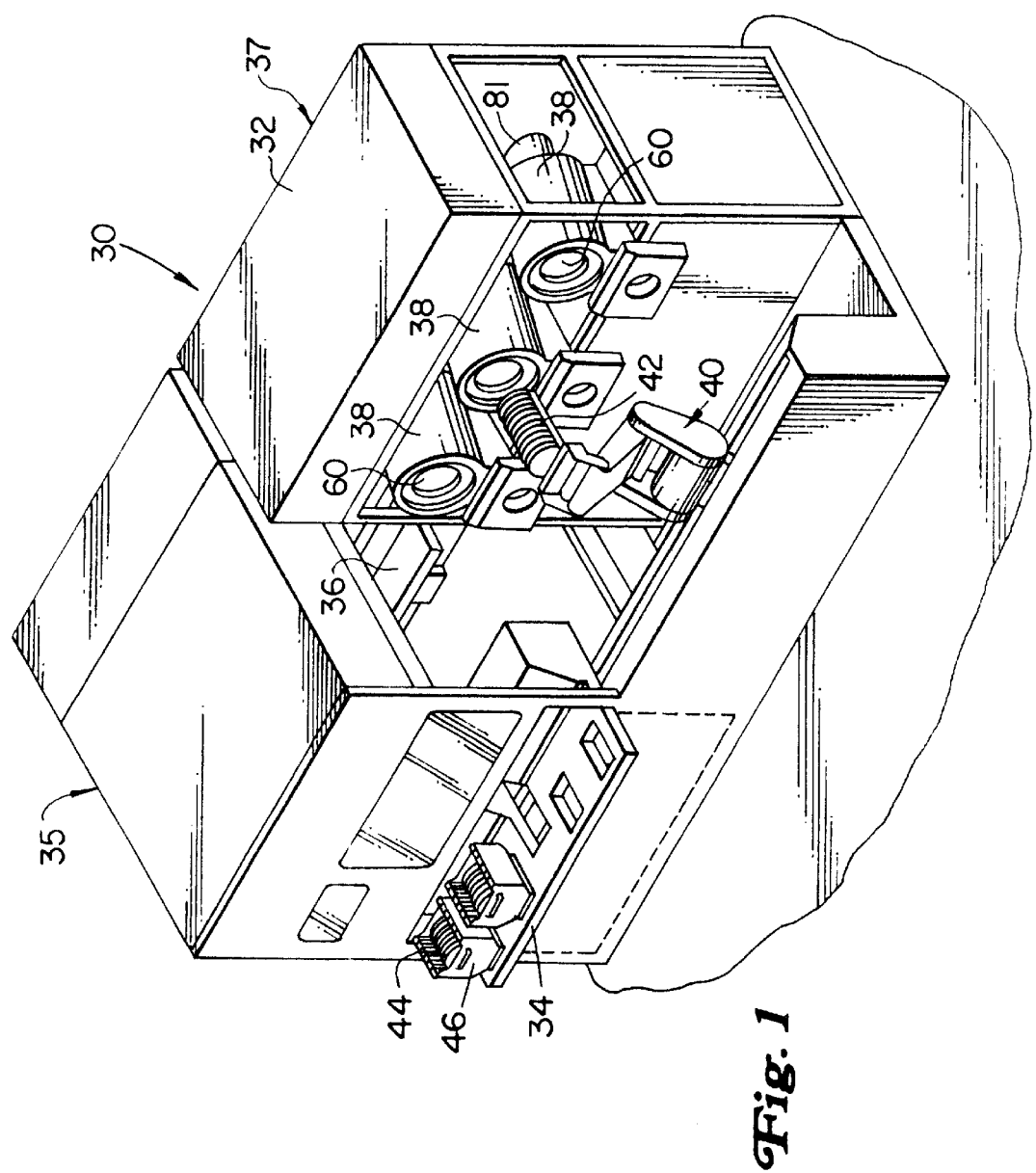
FIG. 1 is a perspective view of the present semiconductor article processing machine.

Turning now in detail to the drawings, as shown in FIG. 1, a machine 30 for processing flat media (i.e., semiconductor wafers, flat panel displays, data disks, photo masks, and other semiconductor or microelectronic articles, referred to herein collectively as "wafers") has an enclosure 32 containing a first section 35 for temporarily storing wafers, and a second section 37, for processing wafers. The first section 35 includes a load/unload unit 34, for moving wafers into and out of the enclosure 32. The first section 35 also preferably includes shelves or other storage areas 36, for temporarily storing the articles 44 to be processed.

The second or processing section 37 includes one or more process chambers 38. A rotor 60 is contained within each of the process chambers 38, for rotating the wafers 44 within the chambers 38.

A transport device or robot 40 is moveable between the first or storage section 35 and the processing section 37, to move wafers to be processed from the storage locations 36, into the process chambers 38, and to remove processed wafers from the chambers 38 back to the storage locations 36, to cycle the wafers through the machine 30, as described, for example, in U.S. Pat. Nos. 5,544,421; 5,660,517; 5,678,320; and 5,784,797, incorporated herein by reference.

Figure 2:
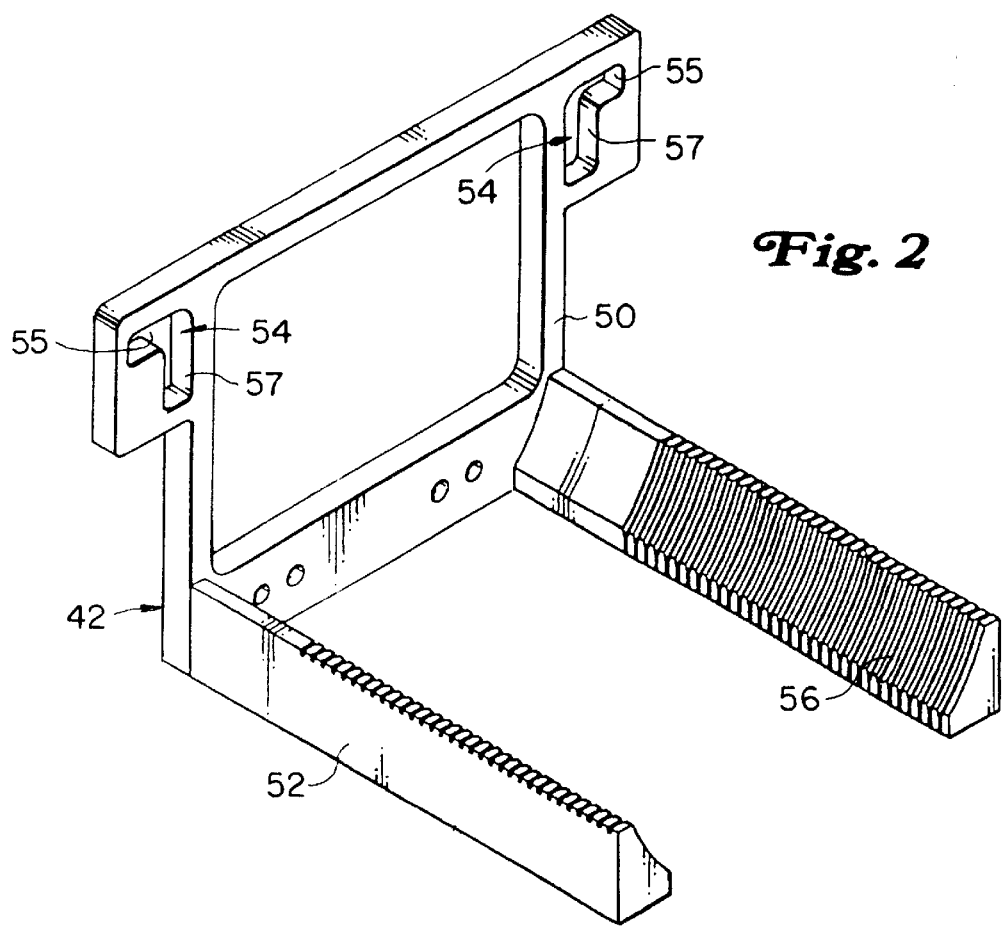
FIG. 2 is a perspective view of a transfer implement or hand used in the machine of FIG. 1.

Turning to FIGS. 1 and 2, the robot or transfer device 40 has a hand or end effector 42 including a frame 50. A pair of arms 52 having grooves or slots 56 are attached to the front side of the frame 50. Drive openings 54 extend through the top corners of the frame 50. The drive openings 54 are symmetrical or mirror images of each other, as described in U.S. Pat. No. 5,784,797.

Figure 3:
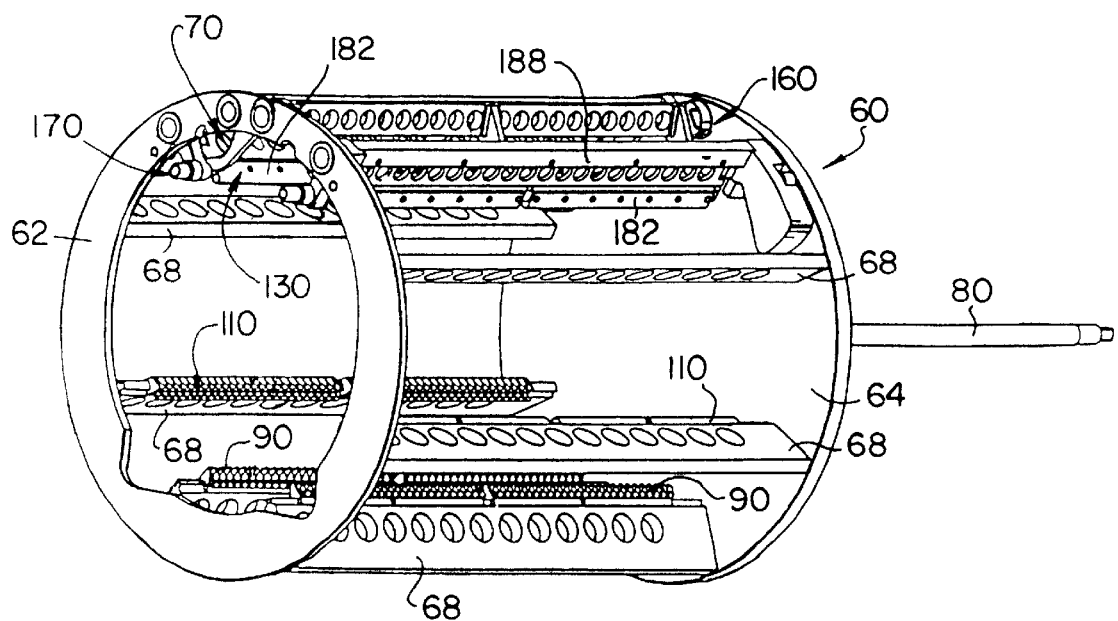
FIG. 3 is a perspective view of the centrifugal processor rotor within the process chambers shown in FIG. 1.

Referring now to FIGS. 1 and 3, the rotor 60 within the process chamber 38 includes a front ring 62 and a back plate or ring 64 connected to each other by connecting bars 68. A drive shaft 80 joined to the back plate 64 is linked to a spin motor 81 behind the process chamber 38, for spinning the rotor during processing. The connecting bars 68 extend parallel to the drive shaft 80, and perpendicular to the plane of the front ring 62 and the back plate 64. The rotor 60 includes a pair of base combs 90, and a pair of side combs 110 opposite to a lockdown assembly 70, for securing the wafers 44 in place during processing.

Figure 4:
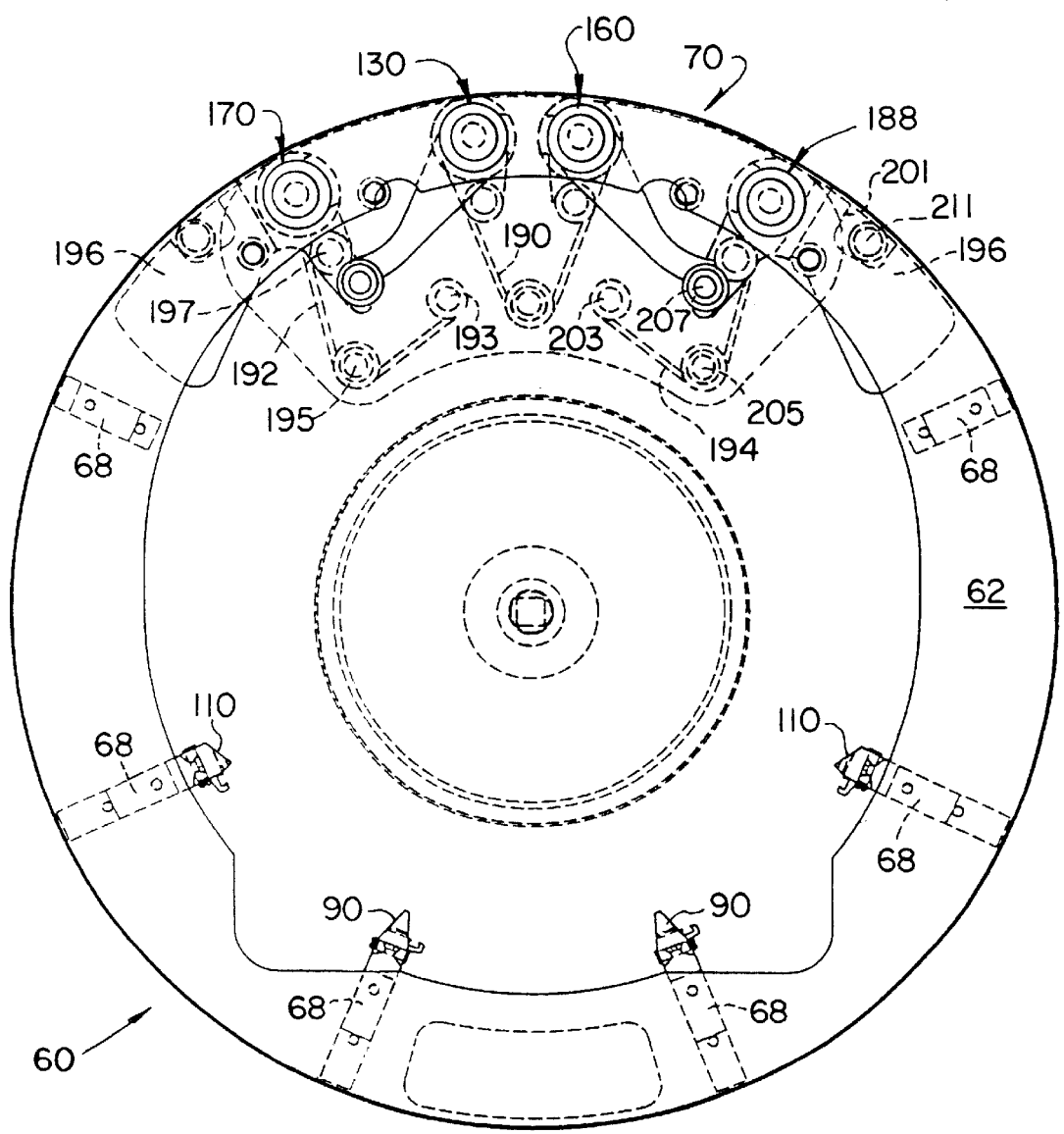
FIG. 4 is the front view of the rotor shown on FIG. 3.

Referring now to FIG. 4, which shows the rotor 60 in its upright or 0° position, the base combs 90 are located at approximately the 5:00 o'clock and 7:00 o'clock positions, while the side combs 110 are located approximately at the 4:00 o'clock and 8:00 o'clock positions. The lockdown assembly 70 is centered about the 12:00 o'clock position, and the vertical center line of the rotor 60.

Turning now to FIGS. 5–8, the base comb 90 has a plurality of teeth 92 spaced apart by gaps 98. The teeth 92 are formed generally in the shape of a four-sided pyramid. Each tooth 92 has a flat back surface 91, a flat front surface 93, and flat side surfaces 95 and 97. The surfaces 91, 93, 95 and 97 taper or converge upwardly towards a rectangular plateau 96 at the tip or top end of each tooth 92. The gap 98 between adjacent teeth 92 has flat side walls 99 and a flat bottom 101. The pitch or spacing between the teeth 92 matches the pitch of the grooves or slots 56 on the hand 42.

Side hooks 102 are attached to the lower front surface 93 of each of the teeth 92. Each side hook 102 has a dove tail O-ring slot 104. An O-ring strip or rod 106, comprising a resilient material, is held within the dove tail O-ring slot 104 in the side hooks 102. The O-ring strip is preferably Kalrez 1050LF perfluoro elastomer. The combs 90 and 110 are preferably a harder thermoplastic. The O-ring strip 106 extends alongside the teeth 92, substantially for the entire length of the base comb 90. The lower end of the base comb 90 includes a dove tail mounting slot 108, for attaching the base comb 90 onto the connecting bars 68, as shown in FIG. 3.

Specifically, the top or inner ends of the connecting bars 68 have a male dove tail fitting as shown in FIG. 4. One or more base combs 90 are attached onto the connecting bars 68, by sliding them on from one end, and pinning them in place. In the embodiment shown in FIG. 3, two separate base combs 90 are provided on the connecting bars 68 at the 5:00 o'clock and 7:00 o'clock positions. However, the specific length and/or number of base combs 90 used will vary with the length (and wafer capacity) of the rotor 60. A pin 109 extending through the base comb 90 and connecting bar 68, secures the base comb into a fixed and preset longitudinal (front/back) position. This prevents movement of the base comb 90 after it is installed, and maintains alignment between the teeth of the two base combs 90, as well as the teeth in the side combs 110.

Turning now to FIGS. 9–12, the side combs 110 are similar to the base combs 90, except that the side combs are positioned at approximately the 4:00 o'clock and 8:00 o'clock positions. In addition, the teeth 112 of the side combs 110 have rounded sides 114 and 115, an elongated flat back surface 120, and a shorter more vertical flat front surface 118. The rounded side walls 114 and 115 and flat front and rear surfaces 118 and 120 come together at a small rectangular plateau or peak 116. The remaining features of the side combs, as shown in FIGS. 9–12, are the same as the features described above in connection with FIGS. 5–8.

Figure 17:
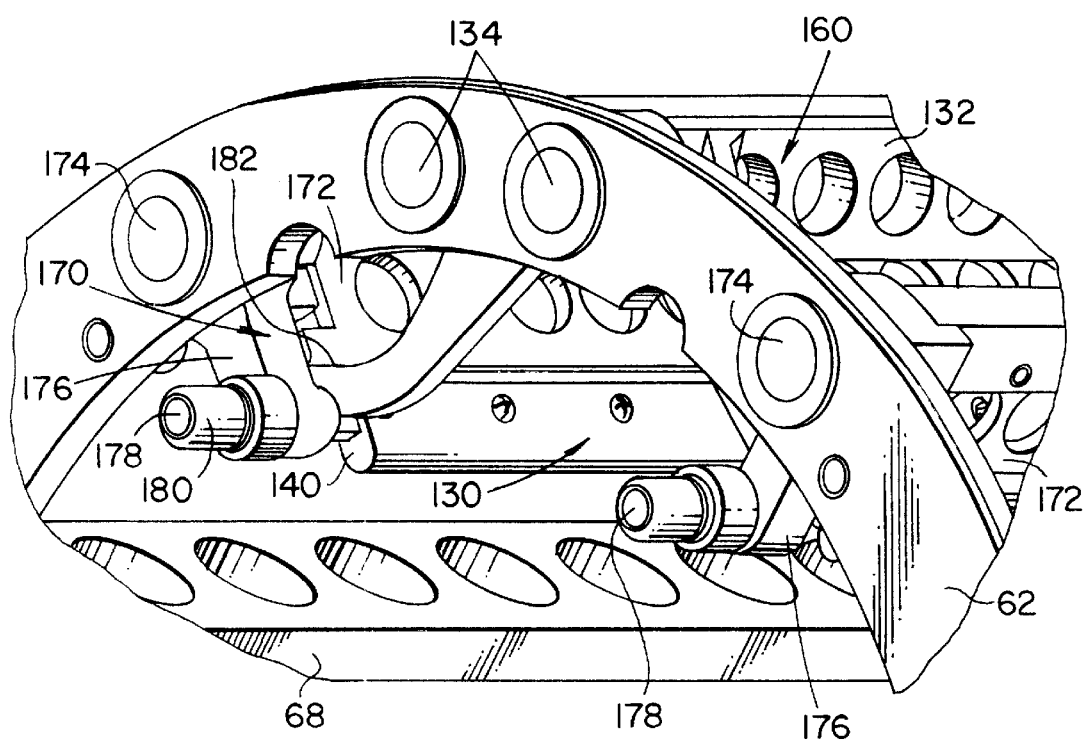
FIG. 17 is an enlarged view of a section of the rotor shown in FIG. 3.

Referring momentarily to FIGS. 3 and 17, the lockdown assembly 70 includes a pair of lock bars and retainers, which are pivotally attached to the front ring 62 and back plate 64. The lock bars move against the retainers, in a cam-like way, to lock the wafers 44 securely in place within the rotor 60, for processing. As shown in FIG. 3, the retainers 130 and 160, and lock bars 170 and 188, are attached to and extend between the front ring 62 and back plate 64, in a direction parallel to the connecting bars 68 and drive shaft 80. Although the drawings show an embodiment having both left and right retainers 130 and 160, and left and right lock bars 170 and 188, principles of the invention apply equally as well to an embodiment having a single retainer and lock bar or having more than two of each.

Figure 13:
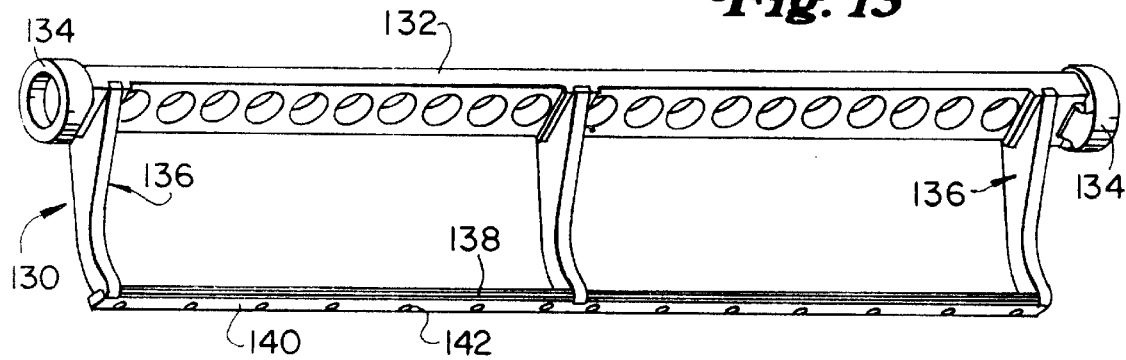
FIG. 13 is a perspective view of the right side article retainer shown in FIGS. 3 and 4, with the left side article retainer shown therein being a mirror image of the right side article retainer.
Figure 14:
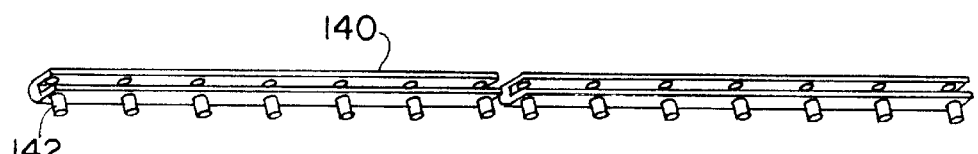
FIG. 14 is a perspective view of the retaining bar cover, which is shown attached to the article retainer in FIG. 13.
Figure 15:
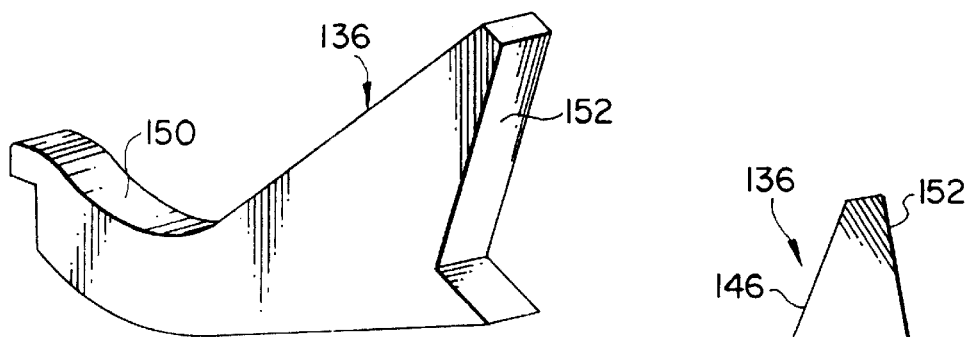
FIG. 15 is a perspective view of one of the arms on the article retainer shown on FIG. 13.
Figure 16:
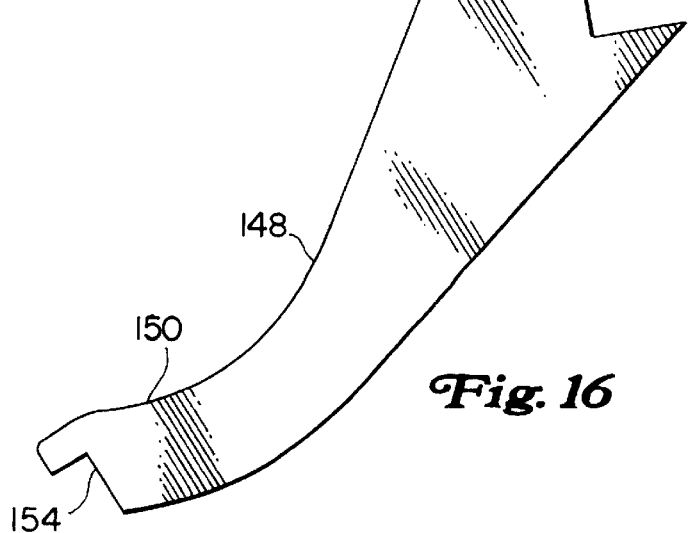
FIG. 16 is a front view thereof.

Referring to FIG. 13, the left retainer 130 has a pivot bar 132 which is pivotally attached to the front ring 62 and back plate 64 via bushings 134. One or more cam arms 136 (3 in the design shown) have a back wall 152 attached to the pivot bar 132, and a front notch 154 attached to a contact bar 138, as shown in FIGS. 13, 15, and 16. The contact bar 138, which is the surface which actually contacts the peripheral edges of the wafers, to secure them in place, is covered with a resilient elastomer non-reactive cover 140, held into place on the contact bar 138 via plastic pins 142 or similar fasteners. The cover 140 is also preferably Kalrez 1050LF.

The use of an elastomer material for the cover 140 and O-ring strip 106 increases the contact and support of the edges of the wafer, despite variability in the rotor and wafer diameters, due to tolerances. As the wafers are better and more reliably supported, clocking or inadvertent wafer movement during processing, and the associated generation of contaminant particles, is reduced.

Turning specifically to FIGS. 15 and 16, the cam arm 136 has a straight outer section 146 transitioning into a first curved section 148, which in turn transitions into a second curved section 150. The surfaces 146, 148 and 150 form a cam surface which controls pivoting movement of the retainer 130, when it is driven or acted on by the lock bar, as further described below.

FIG. 13 shows the left retainer 130, which pivots about an axis just to the left side of the 12:00 o'clock position or vertical axis of the rotor 60, as shown in FIG. 4. The right retainer 160 as shown in FIGS. 3, 4 and 17, is preferably a mirror image of the left retainer 130, and has a pivot access just to the right of the 12:00 o'clock position or vertical axis of the rotor 60.

Figure 18:
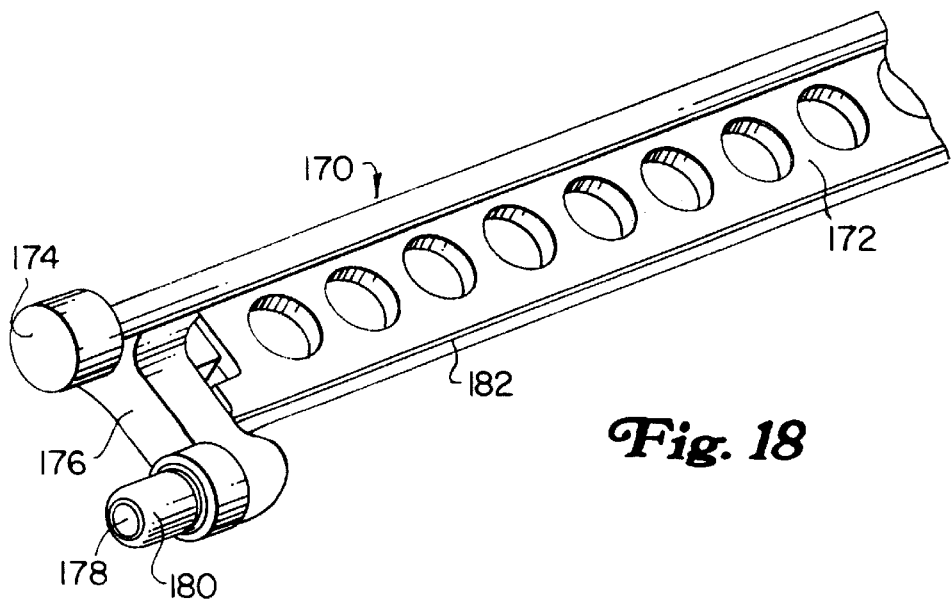
FIG. 18 is a partial perspective view of one of the lock bars shown in FIGS. 3 and 17.

Turning to FIG. 18, the left lock bar 170 has a cam bar 172 having an outer or lower edge 182. A drive stem 178 extends outwardly from a stem arm 176 attached to the cam bar 172. A stem cap or cover 180 is secured onto the drive stem 178. Referring also to FIGS. 3, and 17, the lock bar 170 is pivotably attached to the front ring 62 and back plate 64 via bushings 174. The edge 182 of the cam bar 172, which slidably engages the top cam surface of the cam arms 136 of the retainer 130, also preferably is covered with a non-metal material, to reduce or avoid generating particles during contact with the cam arms.

The right lock bar 188 may be a mirror image of, or the same as, the left lock bar 170.

Figure 19:
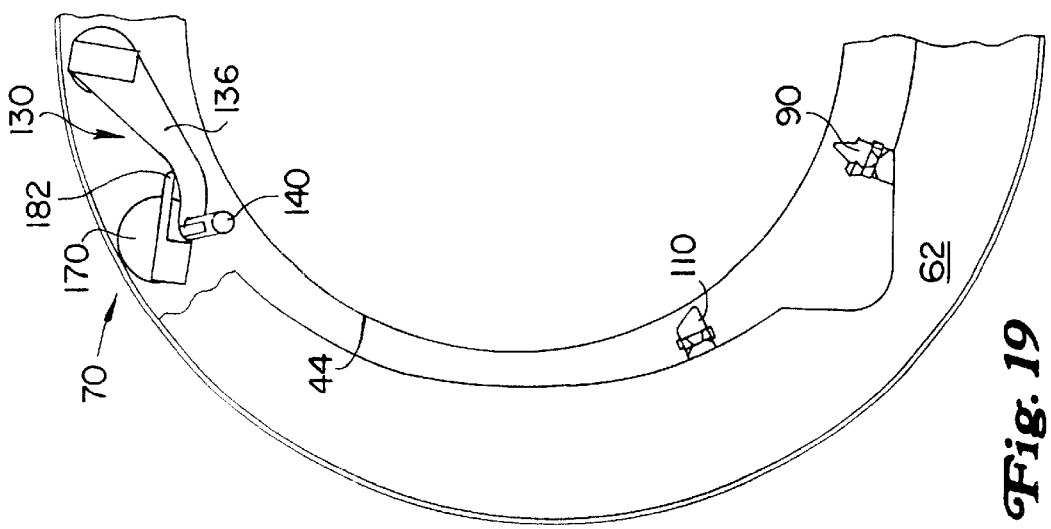
FIG. 19 is a schematic cross-section view of the rotor shown in FIG. 3, showing the left side article retainer in an up or open position.

Referring to FIG. 4, which shows the rotor 60 in the locked or closed position, a retainer spring 190 on the back plate 64 engages both retainers 130 and 160, and biases or urges them outwardly or upwardly (in opposition directions, away from the rotor center) so that the contact bar 138 of each retainer is moved outwardly, or away from the central spin axis of the rotor 60. A left lock bar spring 192 has an inner end 193 pivotably attached to the back plate 64, coils 195, and an outer end 197 pivotably attached to the left lock bar 170. The coils 195 urge the inner end 193 and the outer end 197 apart. When the rotor 60 is in the open position, for loading or unloading, as shown in FIG. 19, the spring 192, which pivots with the lock bar 170 about the inner end 193, pushes the lock bar counterclockwise, to hold it up or open. The counter weight 196 provides added holding force, when the rotor is spinning, via centrifugal force acting to pivot the lock bars into the closed position. A cut out 201 in the counterweight 166 contacts a hardstop 211 on the back plate 64, to limit travel of the lock bars.

The right lock bar spring 194 similarly has an inner end 203, coils 205, and an outer end 207, providing operation which is a mirror image of the left side. The springs 192 and 194 tend to hold the lock bars up, when the rotor 60 is in the open position, and tend to hold the lock bars down or closed, when the rotor 60 is in the closed or locked position.

In FIG. 19, the lockdown assembly 70 (shown and described here only with respect to the left side) is shown in the up or open position, to allow insertion or removal of wafers 44. Due to the geometry (lever arm lengths) of the lock bar 170 and retainer 130, and due to the spring constants of the springs 190 and 192, the lockdown assembly 70 stays in the open position shown in FIG. 19, as the turning moment exerted by the left lock bar 170, via the spring 192, is not sufficient to move the retainer 130 against the force of the retainer spring 190. Consequently, the lockdown assembly 70 stays in the up, retracted or disengaged position, allowing the wafers to be freely inserted.

As the hand 42, shown in FIG. 2 on the robot 40, shown in FIG. 1, moves into the process chamber 38, with a batch of wafers 44 to be processed, the lower section 57 of the drive opening 54 moves over the drive stem 178. With the hand 42 properly positioned, i.e., so that the wafers 44 are aligned with the gaps 98 in the combs 90 and 110, the robot 40 moves the hand 42 downwardly. As this occurs, the lower edges of the wafers 44 come to rest in the gaps 98 in the combs, guided by the surfaces on the teeth 92 and 112. Simultaneously, the downward movement of the hand 42 moves the drive stems 178 outwardly, as the drive stems 178 move from the inner section 57 of the drive opening 54 in the hand 42, to the outer section 55 of the drive opening.

Figure 21:
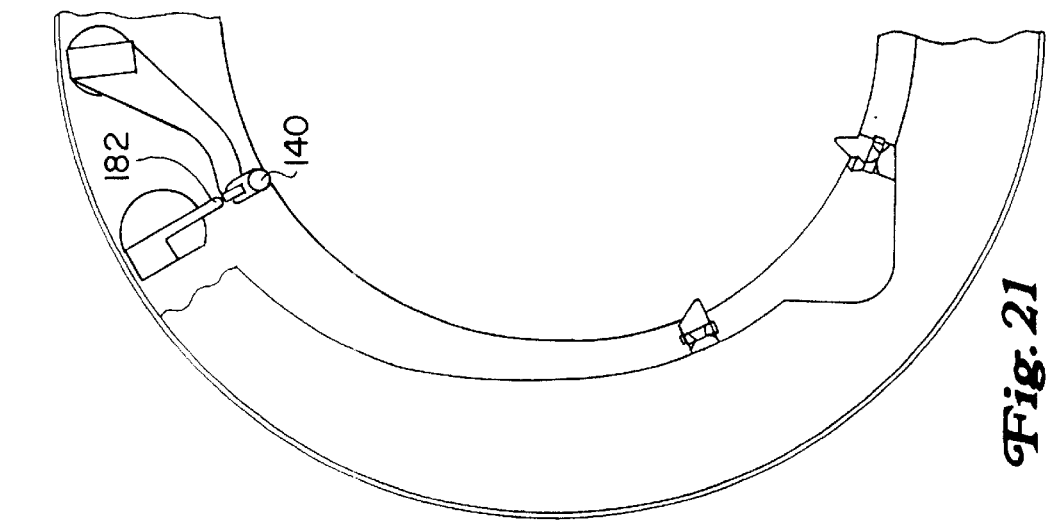
FIG. 21 is a schematic cross-section view of the centrifugal processor rotor shown in FIG. 3, showing the left side article retainer moved into a down or closed position, by the lock bar shown in FIGS. 3, 17 and 18.
Figure 20:
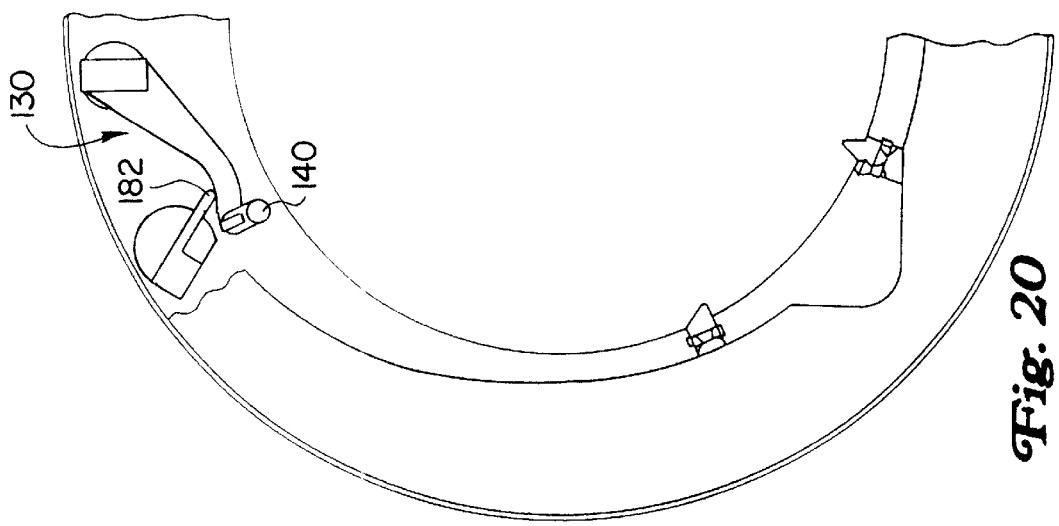
FIG. 20 is a schematic cross-section view of the centrifugal processor rotor shown in FIG. 3 showing the left side article retainer moved into an intermediate position by the lock bar shown in FIGS. 3 and 17.

As this occurs, the lock bars 170 pivot down and away from each other, as shown in FIGS. 19–21. The lower edge 182 of the cam bar 172 moves downwardly along each cam surface on the upper edge of the cam arm 136. With continued downward movement of the hand 42, the lock bar 170 and retainer 130 move from the position shown in FIG. 19, to the positions shown in FIG. 20, and ultimately to the positions shown in FIG. 21. (The movement of the right lock bar 188 and right retainer 160 is equal and opposite (mirror image) of the movement of the left lock bar 170 and left retainer 130, shown in FIGS. 19–21.) As a result, the contact bar 138 moves downwardly in an arc, about the pivot axis of the retainer 130, and contacts an upper peripheral edge of the wafers 44, urging the wafers downwardly into secure engagement with the combs. The O-ring 106 in the combs provides a resilient stop for the edges of the wafers. As shown in FIGS. 19 and 20, the contact bar 138 on the retainer 130 is positioned so that it approaches the wafers 44 virtually perpendicularly, so that the contact bar 138 contacts the wafer edges with little or no sliding contact. This reduces or avoids creating loose particles, which can contaminate the wafers.

The movement of the hand 42, as driven by the robot 40 is sufficient to overcome the spring force tending to hold the lock bar and retainer in the up or open position. However, after the lock bar and retainer are moved, via the hand 42, into the position shown in FIG. 21, the lockdown assembly 70 will remain in the position shown in FIG. 21, even after the hand 42 is removed, due to the cam bar 182 now being in direct alignment with the contact bar 138. Consequently, the spring force acting on the retainer cannot move the retainer away from the wafers 44. The centrifugal force on the counterweight 196 also acts to keep the lock bars in the locked down position, in addition to the springs 192 and 194.

Figure 22:
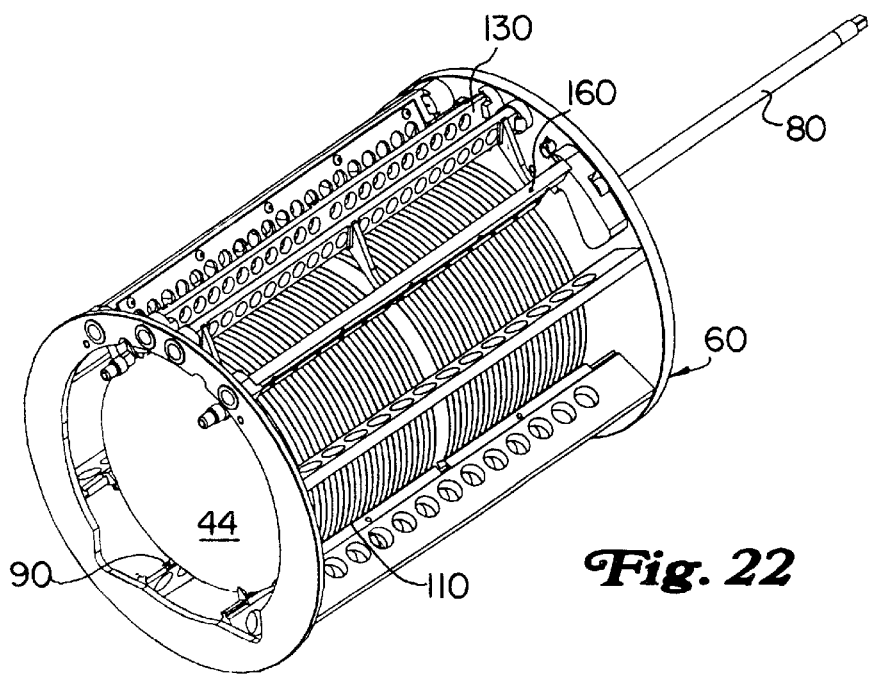
FIG. 22 is a perspective view of the centrifugal processor rotor shown in FIG. 3 holding a batch of round articles.
Figure 23:
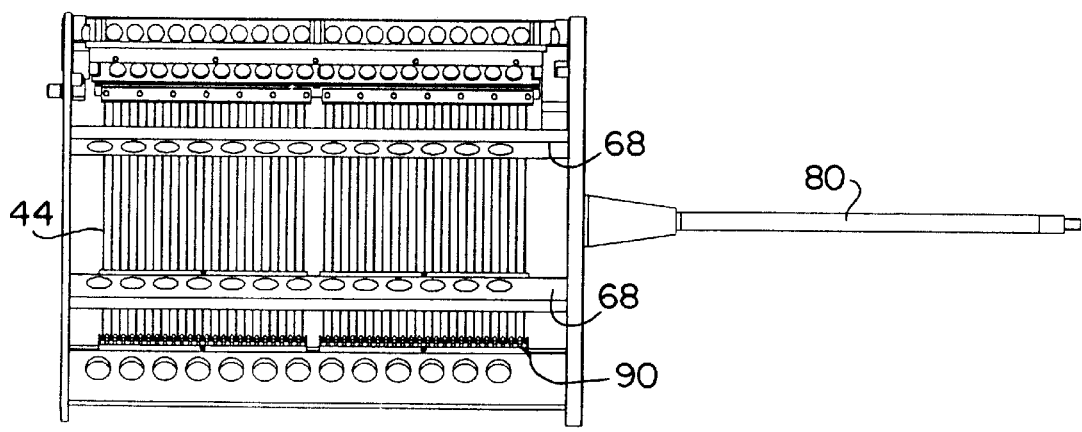
FIG. 23 is a side view thereof.

The first and second curved surfaces 148 and 150 on the top of the cam arm 136, together with the configuration of the drive openings 54, cause the wafers to first come to rest in the combs 90 and 110, before the contact bar 138 begins to exert downward force on the wafers. Consequently, the wafers 44 are first lowered into the combs 90 and 110 via their own weight, and then are subsequently forced slightly further into the combs via the lockdown assembly 70. With the wafers secured within the rotor 30, clocking motion of the wafers, during acceleration and deceleration and/or vibration of the rotor, during processing, is reduced or eliminated. Consequently, particle generation and resulting contamination of the wafers, is reduced. As shown in FIGS. 22 and 23, the lockdown assembly 70 holds the wafers 44 within the rotor 60.

Unlike earlier designs, such as in U.S. Pat. No. 5,784,797, the rotor 60 contacts the edges of the wafers only with resilient elastomer materials, i.e., the O-ring strip 106 and the contact bar cover 140. This reduces generation of particle contaminants. In addition, as the wafers are clamped in place, they can be centered within the rotor, rather than being offset, as no centrifugal force is needed to hold them in place. This avoids the forces and associated wear and particle generation associated with the eccentric spinning of the earlier designs. Clocking of wafers, at start up, and while spinning at high speed, is reduced or avoided, as rotor out-of-balance conditions are avoided and centrifugal force is not needed to hold the wafers in place. Regardless of whether the wafers are centrally or eccentrically positioned in the rotor, the springs, lock bars, and retainers, positively clamp the wafers in place, without relying on centrifugal force, thereby reducing or eliminating unwanted wafer clocking or movement.

Thus, a novel machine and rotor has been shown and described. Various changes can of course be made without departing from the spirit and scope of the invention. The invention, therefor, should not be limited, except by the following claims, and their equivalents.

What is claimed is:

1. A machine for processing flat media, comprising:
   a first section for receiving flat media;
   a second section having at least one process chamber for processing the flat media;
   a robot movable between the first and second sections;
   a rotor rotatably mounted in the at least one process chamber, the rotor comprising a front ring, a lock bar pivotably attached to the front ring, and having a drive stem engageable by the robot, and a retainer pivotably attached to the front ring, and biased into engagement with the lock bar.

2. A machine for processing flat media, comprising:
   a first section for receiving flat media;
   a second section having at least one process chamber for processing the flat media;
   a robot movable between the first and second sections:
   a rotor rotatably mounted in the at least one process chamber, the rotor comprising a front ring, a back plate, a pair of base connecting bars connecting the front ring and the back plate, a pair of base combs on the base connecting bars, a pair of side connecting bars connecting the front ring and back plate, a pair of side combs on the side connecting bars; and
   a lock down assembly on the rotor, the lockdown assembly comprising:
   a left lock bar and a right lock bar pivotably attached to the front ring and to the back plate, with the left lock bar having a drive stem linked to a left cam bar and the right lock bar having a drive stem linked to a right cam bar;
   a left retainer and a right retainer pivotably attached to the front ring and to the back plate, with the left retainer and the right retainer having at least one cam arm biased into contact with the left cam bar and the right cam bar, respectively;
   the left retainer and the right retainer removeable, via engagement and movement of the drive stems, from an open position where articles can be loaded and unloaded into and out of the rotor, to a closed position where articles within the rotor are secured into place between the retainers and the combs.

3. A machine for processing flat media, comprising:
   a first section for receiving flat media;
   a second section having at least one process chamber for processing the flat media;
   a robot movable between the first and second sections;
   a rotor rotatably mounted in the at least one process chamber and having
   a front ring;
   a lock bar pivotably attached to the front ring, the lock bar having a drive stem engageable by a loader/unloader;
   a retainer pivotably attached to the front ring, and biased into engagement with the lock bar; and
   at least one cam arm on the retainer, with the cam arm having a cam surface including a first curved surface and a second curved surface adjoining the first curved surface.

4. The machine of claim 3 wherein the cam surface is configured so that the articles come to rest on the combs before the contact bar contacts the articles.

5. A machine for processing flat media, comprising:
   a first section for receiving flat media;
   a second section having at least one process chamber for processing the flat media;
   a robot movable between the first and second sections;
   a rotor rotatably mounted in the at least one process chamber, the rotor comprising:
   combs for supporting the flat media;
   a contact bar having a cam surface with first and second curved surfaces, the contact bar engageable at least indirectly by the robot, and moveable from a first position, where flat media can be placed into or removed from the rotor, to a second position, where the contact bar engages the flat media to secure it into place against the combs; and
   a lock bar engaged against the cam surface.

6. A machine for processing flat media, comprising:
   a first section for receiving flat media;
   a second section having at least one process chamber for processing the flat media;
   a rotor in the at least one process chamber, the rotor comprising lock down means for securing flat media into place within the rotor, the lock down means comprising a lock down assembly including:
   a left lock bar having a drive stem linked to a left cam bar;
   a right lock bar having a drive stem linked to a right cam bar;
   a left retainer and a right retainer, with the left retainer and the right retainer having at least one cam arm biased into contact with the left cam bar and the right cam bar, respectively;
   the left retainer and the right retainer moveable, via engagement and movement of the drive stems, from an open position, where, articles can be loaded and unloaded into and out of the rotor, to a closed position where articles within the rotor are secured into place between the retainers and the combs; and
   transport means for moving flat media into and out of the rotor.

7. A machine for processing flat media, comprising:
   a first section for receiving flat media;
   a second section having at least one process chamber for processing the flat media;
   a robot movable between the first and second sections;
   a rotor rotatably mounted in the at least one process chamber, the rotor comprising:
   a contact bar moveable from a first position, where flat media can be placed into or removed from the rotor, to a second position, where the contact bar engages the flat media to secure it into place within the rotor; and
   a lock bar engaged against a cam surface on the contact bar for urging the contact bar from the first position to the second position.

8. The machine of claim 7 wherein the contact bar contacts the flat media perpendicularly and without sliding movement between the contact bar and the flat media.

9. The machine of claim 7 further comprising combs on the rotor, the combs having a plurality of teeth for receiving the flat media.

10. The machine of claim 9 wherein the combs comprise at least one base comb and at least one side comb for securing the flat media within the rotor.

11. The machine of claim 10 wherein at least one of the teeth of the base comb is formed substantially in the shape of a four-sided pyramid having a substantially rectangular surface at a top end of the tooth.

12. The machine of claim 10 wherein at least one of the teeth of the side comb has rounded sides terminating at a flat surface at a top end of the tooth.

13. The machine of claim 9 wherein at least one comb includes a rod comprised of an elastomeric material attached alongside the teeth of the comb substantially for an entire length of the comb, the rod adapted to contact and support edges of the flat media to secure the flat media within the rotor.

14. The machine of claim 7 wherein the contact bar includes a cover comprised of an elastomeric material.

15. The machine of claim 7 wherein the cam surface comprises a first curved surface transitioning into a second curved surface.

16. The machine of claim 7 wherein the lock bar is engageable by the robot for urging the contact bar from the first position to the second position.

17. A machine for processing flat media, comprising:
a first section for receiving flat media;
a second section having at least one process chamber for processing the flat media;
a robot moveable from the first section to the second section;
a rotor in the at least one process chamber, the rotor comprising contact means moveable from a first position, where flat media can be placed into or removed from the rotor, to a second position, where the contact means engages the flat media to secure it into place within the rotor, and the rotor also comprising a locking means engaged against the contact means for urging the contact means from the first position to the second position, with the locking means engageable by the robot.

18. The machine of claim 17 wherein the contact means comprises a contact bar engageable at least indirectly by the transport means.

19. The machine of claim 17 wherein the locking means comprises a lock bar engageable by the transport means for urging the contact means from the first position to the second position.

20. A machine for processing flat media, comprising:
a first section for receiving flat media;
a second section having at least one process chamber for processing the flat media;
a robot movable between the first and second sections;
a rotor rotatably mounted in the at least one process chamber, the rotor comprising:
a contact bar moveable from a first position, where flat media can be placed into or removed from the rotor, to a second position, where the contact bar engages the flat media to secure it into place within the rotor;
a lock bar engaged against the contact bar for urging the contact bar from the first position to the second position; and
a spring urging the contact bar into engagement with the lock bar.

* * * * *